(12) United States Patent
Shigenami et al.

(10) Patent No.: US 7,012,831 B2
(45) Date of Patent: Mar. 14, 2006

(54) SEMICONDUCTOR MEMORY DEVICE

(75) Inventors: Kenichi Shigenami, Kanagawa (JP); Shunichi Sukegawa, Ibaraki (JP)

(73) Assignee: Sony Corporation, (JP)

( * ) Notice: Subject to any disclaimer, the term of this patent is extended or adjusted under 35 U.S.C. 154(b) by 236 days.

(21) Appl. No.: 10/749,559

(22) Filed: Jan. 2, 2004

(65) Prior Publication Data
US 2004/0190326 A1 Sep. 30, 2004

(30) Foreign Application Priority Data
Jan. 8, 2003 (JP) ............................ P2003-002472

(51) Int. Cl.
*G11C 11/24* (2006.01)
(52) U.S. Cl. ...................................... 365/149; 365/190
(58) Field of Classification Search ................ 365/149, 365/190, 230.06
See application file for complete search history.

(56) References Cited

U.S. PATENT DOCUMENTS

| | | | | |
|---|---|---|---|---|
| 4,943,944 A | * | 7/1990 | Sakui et al. ........... | 365/189.05 |
| 5,012,447 A | * | 4/1991 | Matsuda et al. ........... | 365/206 |
| 5,220,527 A | * | 6/1993 | Ohsawa ........................ | 365/149 |
| 5,323,345 A | * | 6/1994 | Ohsawa .................. | 365/189.01 |

* cited by examiner

*Primary Examiner*—Tan T. Nguyen
(74) *Attorney, Agent, or Firm*—Rader Fishman & Grauer PLLC; Ronald P. Kananen

(57) ABSTRACT

A semiconductor memory device for realizing high speed writing while maintaining the credibility of write data, wherein a write gate is provided between a bit line and an input/output data line of a memory cell array, the write gate becomes open when a selected word line becomes an activation state and a write signal set to the input/output data line in accordance with write data is applied to the selected bit line via the write gate when writing, so that writing of data to a selected memory cell can be performed immediately after activating the selected word line when writing, and writing to the selected memory cell can be performed in parallel with reading and refreshing of non-selected memory cells, and consequently, a time for storing charges to the selected memory cell can be sufficiently secured and writing at a high speed can be realized.

5 Claims, 6 Drawing Sheets

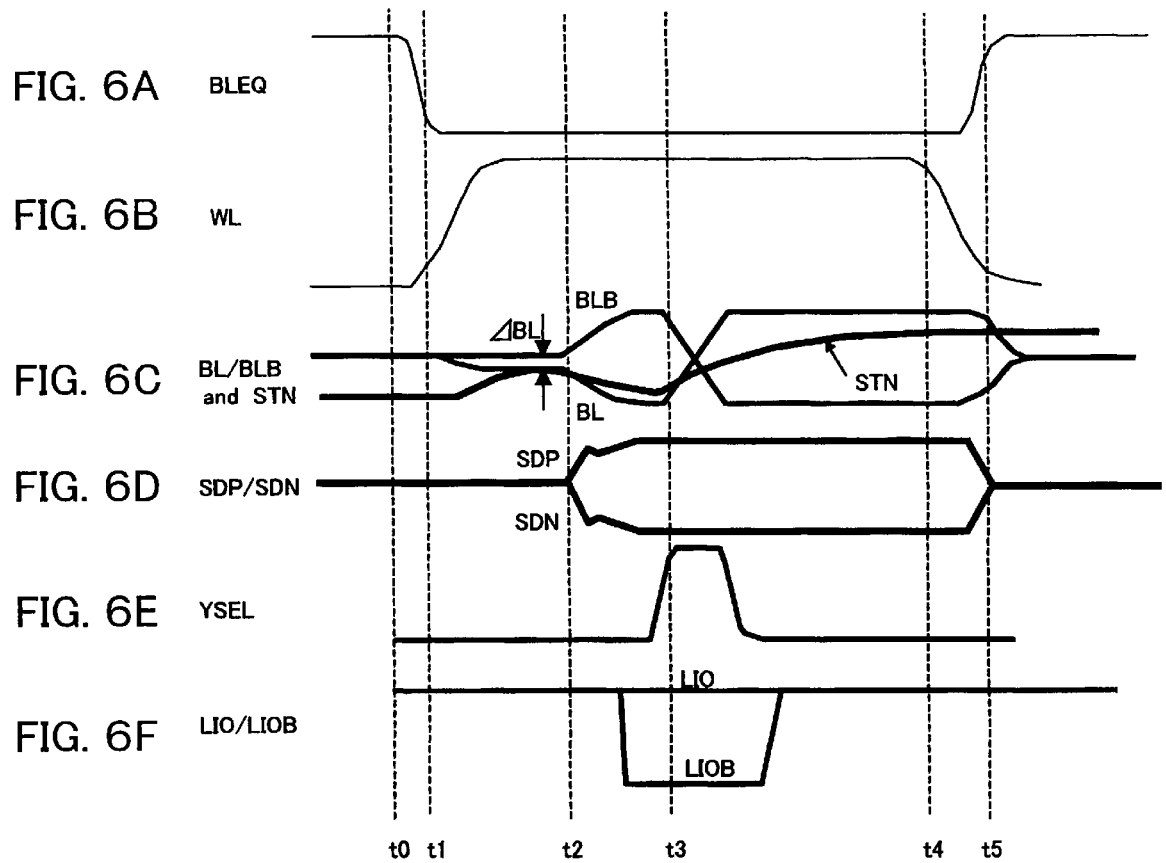
FIG. 6A BLEQ
FIG. 6B WL
FIG. 6C BL/BLB and STN
FIG. 6D SDP/SDN
FIG. 6E YSEL
FIG. 6F LIO/LIOB

SEMICONDUCTOR MEMORY DEVICE

BACKGROUND OF THE INVENTION

1. Field of the Invention

The present invention relates to a Dynamic Random Access Memory (DRAM) as a semiconductor memory device and, particularly, to a DRAM for realizing data writing at a high speed.

2. Description of the Related Art

A DRAM is a semiconductor memory device for storing data in accordance with stored charges of capacity elements, and a memory cell normally comprises one capacitor and one transistor. In each memory cell, a control terminal (gate) of the transistor is connected to a word line and a memory cell is selected by an activation voltage applied to the word line.

FIG. 5 is a circuit diagram of a partial configuration of a normal DRAM. As shown in FIG. 5, the DRAM comprises a memory cell array 100a, a bit line equalizer 102, a sense amplifier 150a and a column selector 160a.

Note that, in FIG. 5, a row decoder for selecting a word line and a column decoder for outputting a column selection signal YSEL for selecting a column are omitted.

The memory cell array 100a comprises a plurality of memory cells arranged in a matrix. Note that only two memory cells MC1 and MC2 are illustrated in FIG. 5 as an example.

As shown in FIG. 5, the memory cell MC1 comprises a transistor, for example, a nMOS transistor Tr1 and a capacitor Cs1 for holding charges. A gate of the transistor Tr1 is connected to a word line $WL_n$, one electrode is connected to a bit line BL, and the other electrode is connected to the capacitor Cs1. One electrode of the capacitor Cs1 is connected to the transistor Tr1, and the other electrode is connected to a plate line. The plate line is kept, for example, at a voltage Vp.

The memory cell MC2 has approximately the same configuration as that of the memory cell MC1 as shown in FIG. 5, and comprises a transistor Tr2 and a capacitor Cs2. A gate of the transistor Tr2 is connected to a word line $WL_{n+1}$ and one electrode is connected to a bit line BLB. Note that the capacitors Cs1 and Cs2 share a via and are connected to the plate line.

The word lines $WL_n$ and $WL_{n+1}$ are selected by a not shown row decoder. An activation voltage is applied to a selected word line in accordance with a row address. Here, for example, the activation voltage is set at a voltage which is higher than a power source voltage $V_{DD}$ by an amount of a threshold voltage $V_{thn}$ of the nMOS transistor composing the memory cells MC1 and MC2.

The bit lines BL and BLB form a bit line pair. The bit lines BL and BLB are equalized to be at a voltage Vb by the bit line equalizer 102. When reading, a voltage difference that has arisen between the bit lines BL and BLB is amplified by the sense amplifier 150a in accordance with stored data of a selected memory cell.

Between the bit line BL and a data line LIO is connected a transistor Q4 constituting the column selector 160a, and between the bit line BLB and a data line LIOB is connected a transistor Q5 constituting the column selector 160a.

The equalizer 102 comprises transistors Q1, Q2 and Q3, as shown in FIG. 5. Gates of these transistors are connected to a signal line applied with a bit line equalization signal BLEQ. Since the bit line equalization signal BLEQ is in an activated state, that is, held at a high level before reading, the transistors Q1, Q2 and Q3 become conductive and the bit lines BL and BLB are held at an equalization voltage Vb. After starting to read, the bit line equalization signal is switched to be at a low level, the transistors Q1, Q2 and Q3 are cut off, and the bit lines BL and BLB become a floating state.

The sense amplifier 150a comprises pMOS transistors PT1 and PT2 and nMOS transistors NT1 and NT2, as shown in FIG. 5. These MOS transistors constitute a latch circuit comprising two inverters wherein input/output terminals are connected to each other. The bit lines BL and BLB are respectively connected to both terminals of the latch circuit. A drive voltage SDP is supplied to the pMOS transistors PT1 and PT2 side, and a drive voltage SDN is supplied to the nMOS transistors NT1 and NT2 side. Note that when operating the sense amplifier, for example, the drive voltage SDP is held at a power source voltage $V_{DD}$ and the drive voltage SDN is held at a ground voltage. On the other hand, when the sense amplifier is on standby, the drive voltages SDP and SDN are held, for example, at an intermediate voltage of the power source voltage $V_{DD}$ and the ground voltage.

When reading, the sense amplifier 150a is supplied with the drive voltages SDP and SDN and activated in accordance therewith. At this time, the sense amplifier amplifies a potential difference of the bit lines BL and BLB, so that stored data of a selected memory cell are read out to be output to the outside.

In the column selector 160a, the transistors Q4 and Q5 are controlled by a column selection signal YSEL. The column selection signal YSEL is supplied by a not shown column decoder. When reading and writing, a column selection signal YSEL corresponding to a selected column is activated, that is, held at a high level. In response to this, the transistors Q4 and Q5 become conductive, and when reading, voltages of the bit lines BL and BLB amplified by the sense amplifier 150a are respectively output to the data lines LIO and LIOB, while when writing, signal voltages of the data lines LIO and LIOB are respectively output to the bit lines BL and BLB.

FIGS. 6A to 6F are timing charts of a writing operation of the DRAM shown in FIG. 5. Note that an explanation will be made by taking as an example a writing operation by random accessing in the DRAM here.

Below, with reference to FIG. 5 and FIG. 6, a writing operation of the DRAM in random accessing will be explained.

Writing to the DRAM includes a reading operation. This is for refreshing stored data in memory cells connected to a selected word line but not intended to be written and ensuring credibility of data. Namely, when writing, reading is performed on all memory cells connected to the selected word line. After that, write data input from the outside are written in a selected memory cell, and read data are written in other memory cells.

As shown in FIG. 6, a bit line equalization signal BLEQ is activated before writing, the bit line equalizer 102 is activated in response thereto, and the bit lines BL and BLB are precharged at a voltage Vb. At a time t0 after starting to read, the bit line equalization signal BLEQ is deactivated (reset and held, for example, at a low level), and the bit lines BL and BLB are held in a floating state in response thereto.

After that, at a time t1, a word line WL is selected by the row decoder and activated. Here, the selected word line WL is applied with a higher voltage than the power source voltage $V_{DD}$. Thus, transistors of memory cells connected to the selected word lines WL are activated and switched to be in a conductive state. At the same time, due to a distribution of charges stored in storage nodes STN of the respective memory cells, that is, connection nodes of transistors and capacitors and charges of the bit lines BL and BLB at a precharge level, a potential difference ΔBL arises between the bit lines BL and BLB.

As shown in FIG. 6D, at a time t2 when the potential difference ΔBL of the bit lines BL and BLB reaches a predetermined level, the sense amplifier 150a is supplied with drive voltages SDP and SDN. In response to this, the sense amplifier 150a operates to amplify the potential difference between the bit lines BL and BLB. Therefore, in memory cells other than the selected memory cell, stored data are re-written in accordance with a voltage of the amplified bit line BL or BLB. Namely, the stored data are refreshed.

At a time t3 when read data are amplified by the sense amplifier 150a, a column selection signal YSEL corresponding to a column selected by the column decoder is activated. As a result, in the column selector 160a, transistors Q4 and Q5 corresponding to the selected column become open and a write signal input to the data lines LIO and LIOB in accordance with write data is applied to the bit lines BL and BLB, respectively.

Note that, in FIG. 6C, voltage changes of the bit lines BL and BLB in the case where the write data and read data are different. As shown in FIG. 6E, when the column selection signal YSEL is activated at the time t3, voltages of the bit lines BL and BLB are reversed in accordance with the write signal applied to the data lines LIO and LIOB. Then, the reversed voltages of the bit lines BL and BLB are held by the sense amplifier 150a. Thus, in accordance with the voltage of the bit line BL or BLB, stored charges of a capacitor of the selected memory cell are controlled and the write data are written in the selected memory cell.

After finish writing, at a time t4 as shown in FIG. 6A to FIG. 6F, the selected word line WL is held at a low level by the row decoder, and the drive signals SDP and SDN applied to the sense amplifier 150a are held at a predetermined intermediate potential. Then, in preparation for the next reading or writing, the bit line equalization signal BLEQ is activated and the bit lines BL and BLB are precharged at the voltage Vb in accordance therewith. Consequently, the writing operation is completed.

In the DRAM as a semiconductor memory device disclosed in a Japanese Unexamined Patent Publication No. 3-273594, writing starts after finishing the equalization of bit lines and amplifying read data by the sense amplifier as explained above. Since a predetermined length of writing time has to be secured for sufficiently securing a write charge amount to a selected memory cell, it is hard to realize high speed writing.

In recent years, in a memory for a cache memory and a network, when replacing a SRAM of a high bit unit-cost with a DRAM of a low bit unit-cost with a low power consumption, the DRAM is required to have a high speed random access characteristic. A memory cell of an SRAM is almost the same as a sense amplifier of a DRAM and comprises, for example, six MOS transistors. Random accessing of the SRAM is equivalent to page mode accessing of the DRAM. However, random accessing of the DRAM requires an excessive period for amplifying data read by the sense amplifier after finishing bit line equalization for a normal page mode accessing and a precharge period for the next access by restoring the amplified data as explained above.

Furthermore, it is significant in writing that how much charge stored by writing in a storage node of a memory cell reside until the next reading; and when the residual charge amount becomes a little, stored data cannot be correctly read in the next reading. A charge amount stored in the storage node of the memory cell by writing is determined by the time length from latching of a sense amplifier until resetting of a word line.

However, in a random access mode, as writing becomes high speed, a phenomenon appears that an amount of charge injected into a memory cell decreases and a potential of the storage node after writing becomes insufficient. As a result, a writing operation of a memory cell array at a high speed is hindered. Namely, a sufficient writing period has to be secured for securing a potential of the storage node, and it becomes difficult to shorten the writing period. The disadvantage can be solved to a certain extent by reducing the on-resistance of a transistor of the memory cell, but when considering gate breakdown voltage of the transistor and leakage of stored charges of the storage node of the memory cell, the effects of improvement cannot be expected to be much.

SUMMARY OF THE INVENTION

An object of the present invention is to provide a semiconductor memory device for realizing high speed writing and maintaining credibility of write data in a random access operation of a DRAM.

To attain the above object, according to the present invention, there is provided a semiconductor memory device including word lines provided for every row of a memory cell and bit lines provided for every column of the memory cell, wherein a memory cell array is configured by arranging in a matrix memory cells for storing data in accordance with stored charges of capacity elements, comprising a write gate provided between a bit line and an input/output data line, which becomes a conductive state when a selected word line becomes an activation state when writing and selectively applies to the bit line a write signal applied to an input output data line in accordance with write data.

Also, according to the present invention, there is provided a semiconductor memory device including word lines provided for every row of a memory cell and bit lines provided for every column of the memory cell, wherein a memory cell array is configured by arranging in a matrix memory cells for storing data in accordance with stored charges of capacity elements, comprising a column selection circuit for selecting one from a plurality of columns in accordance with an address, and a write gate provided between the column selection circuit and input/output data line, which becomes a conductive state when a selected word line becomes an activation state when writing and applies to the selected bit line a write signal applied to the input/output data line in accordance with write data via the column selection circuit.

Also, preferably, a decoder circuit wherein the write gate comprises a switching element connected between the bit line and input/output data line, and generates a selection signal for making the switching element corresponding to a column selected by an input address conductive and supplies to the write gate when writing is provided.

Furthermore, preferably, a bit line pair composed of two bit lines is provided to each column and two bit lines of the bit pair are arranged to be a twist layout in the memory cell array.

According to the present invention, a write gate is provided between a bit line and an input/output data line provided to each column of a memory cell array, and when writing, the write gate becomes an open state together with an activation of the selected word line and a write signal set to the input/output data line in accordance with write data is applied to the selected bit line via the write gate. Thus, in writing, data writing can be performed on the selected memory cell immediately after the activation of the selected word line, and writing to the selected cell is performed in parallel with reading and refreshing of non-selected memory cells, so that a storing time of charges can be sufficiently secured for a capacitor of the selected memory cell and writing at a high speed can be realized.

BRIEF DESCRIPTION OF DRAWINGS

These and other objects and features of the present invention will become clearer from the following description of the preferred embodiments given with reference to the attached drawings, in which:

FIG. 6A to FIG. 6F are timing charts of a writing operation of the DRAM of the related art.

DESCRIPTION OF THE PREFERRED EMBODIMENT

First Embodiment

Figure 1:
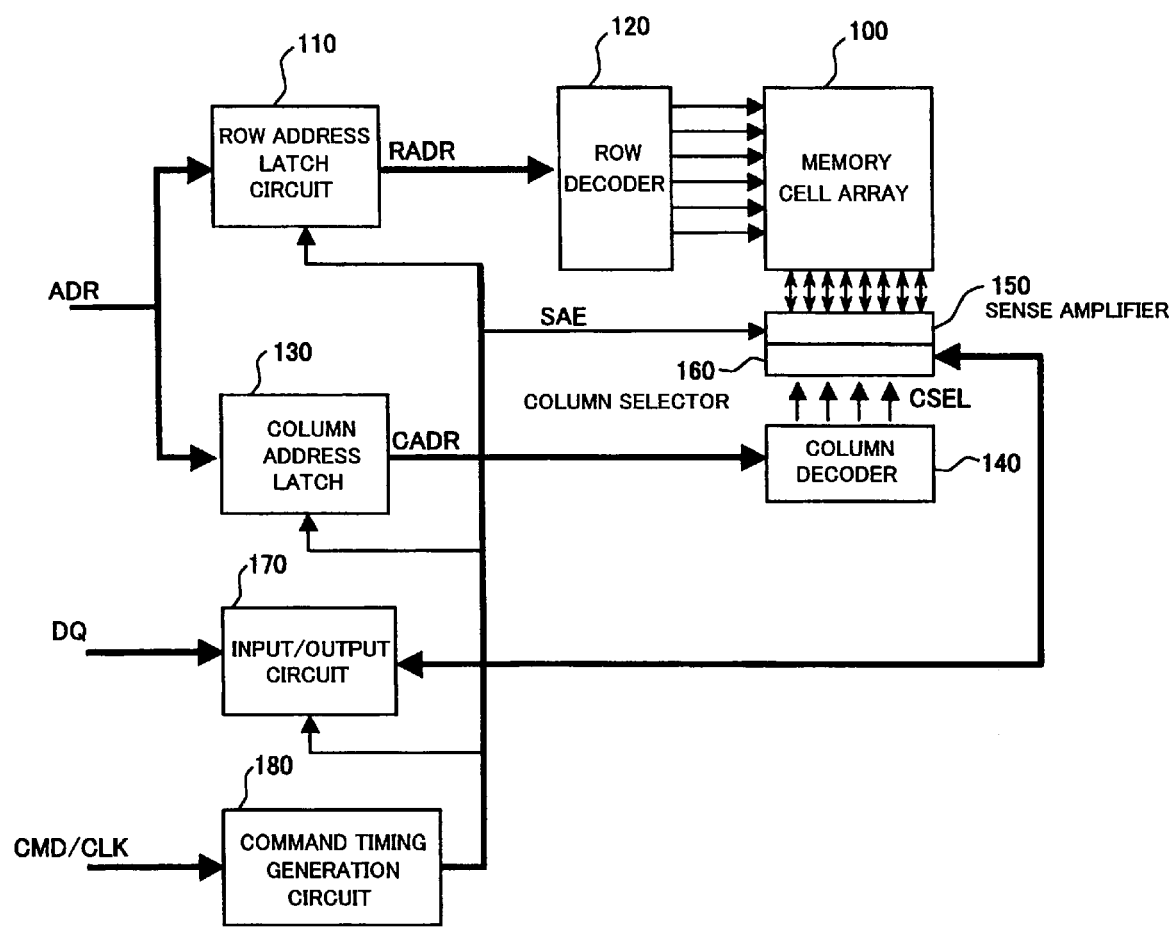
FIG. 1 is a view of the configuration of a first embodiment of a semiconductor memory device according to the present invention.

FIG. 1 is a block diagram of the configuration of a semiconductor memory device, that is, a DRAM according to the present invention.

As shown in FIG. 1, the DRAM comprises a memory cell array 100, a row address latch circuit 110, a row decoder 120, a column address latch circuit 130, a column decoder 140, a sense amplifier 150, a column selector 160, an input/output circuit 170 and a command timing generation circuit 180.

Below, each component of the DRAM will be explained.

The memory cell array 100 is configured by arranging a plurality of memory cells in a matrix. A word line is arranged for each line of the matrix made by the memory cells, and each column is arranged with a bit line pair composed of a bit and a bit complementary line. When reading and writing, a word line specified by a row address RADR is selected in accordance with the row address RADR, so a memory cell connected to the selected word line is selected. Then, reading or writing of data is performed on the selected memory cell via the bit line.

The row address latch circuit 110 holds a row address RADR among addresses ADR input from the outside and outputs it to the row decoder 120.

In accordance with the row address RADR from the row address latch circuit 110, the row decoder 120 selects a word line specified by the row address RADR and applies a predetermined activation voltage to the selected word line.

The column address latch circuit 130 holds a column address CADR among addresses ADR input from the outside and outputs it to the column decoder 140.

In accordance with the column address CADR from the column address latch circuit 130, the column decoder 140 generates a column selection signal CSEL for selecting a bit line specified by the column address CADR and outputs it to the column selector 160.

When reading, the sense amplifier 150 amplifies a voltage difference arising in the selected bit line pair in accordance with stored data of the selected memory cell and outputs the amplified result as read data to the outside via the input/output circuit 170. When writing, in accordance with write data input via the input/output circuit 170, a differential voltage having a predetermined amplitude is generated on the selected bit line, and thereby, write data are stored in the selected memory cell.

In accordance with a column selection signal CSEL input from the column decoder 140, the column selector 160 selects a column specified by the column address. As a result, reading or writing is performed by a sense amplifier corresponding to the selected column.

When reading, the input/output circuit 170 holds read data from the sense amplifier selected by the column selector 160 and outputs then to the outside. When writing, the input/output circuit 170 holds write data DQ input from the outside and outputs then to the sense amplifier selected by the column selector 160.

The command timing generation circuit 180 generates a command and timing control signal for controlling an operation of the above respective partial circuits in accordance with a command CMD and a system clock signal CLK input from the outside and supplies the signal to the respective partial circuits. For example, the command timing generation circuit 180 outputs a latch control signal for controlling timing to hold an address to the row address latch circuit 110 and the column address latch circuit 130. Also, the command timing generation circuit 180 outputs a sense amplifier enable signal SAE to the sense amplifier 150, and furthermore, outputs to the input/output circuit 170 an input/output timing control signal for controlling the input/output timing of data.

In the DRAM of the present embodiment configured by the above partial circuits, in accordance with the command and timing control signal output from the command timing generation circuit 180, the row address RADR and column address CADR included in an address ADR to be input are latched by the row address latch circuit 110 and the column address latch circuit 130. The row decoder 120 selects a word line in accordance with the row address RADR, and the selected word line is activated. Then, a column selection signal CSEL is generated in accordance with the column address CADR, a predetermined sense amplifier is selected by the column selector 160 in accordance therewith, and reading and writing are performed on the selected memory cell corresponding to the sense amplifier.

Next, the configuration of the DRAM of the present embodiment will be explained further in detail with reference to a partial circuit of the DRAM of the present embodiment shown in FIG. 2.

Figure 2:
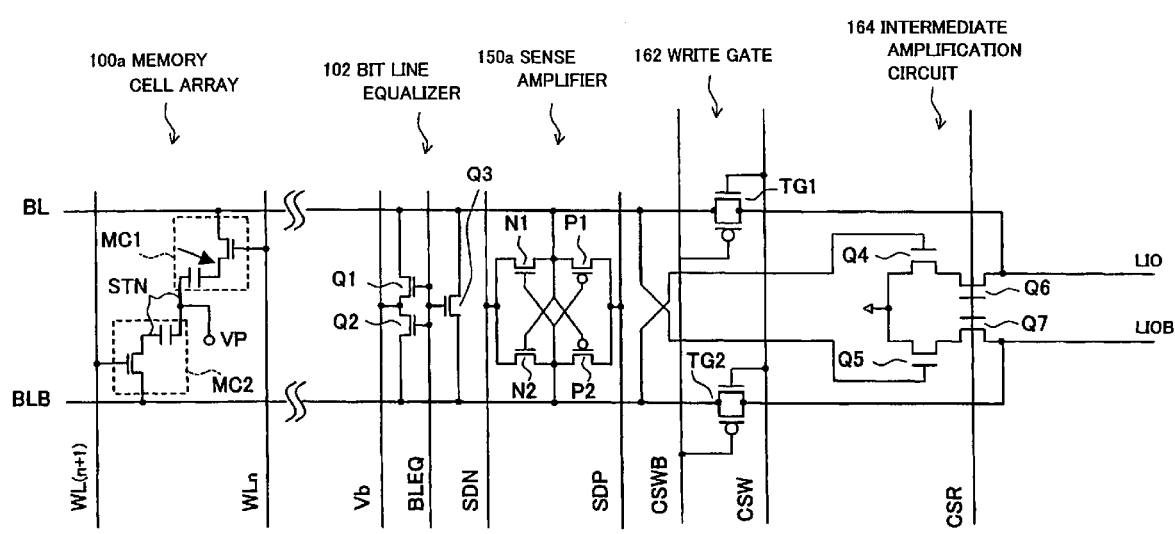
FIG. 2 is a circuit diagram of the configuration of a DRAM of the present embodiment.

The partial circuit of the DRAM comprises, as shown in FIG. 2, a memory cell array 100a, a bit line equalizer 102, a sense amplifier 150a, a write gate 162 and an intermediate amplification circuit 164.

Below, each component of the DRAM shown in FIG. 2 will be explained.

The memory cell array 100a is a part of the memory cell array 100 shown in FIG. 1. As explained above, the memory cell array 100 is configured by arranging a plurality of memory cells in a matrix. Note that in the memory cell array 100a shown in FIG. 2, only two memory cells MC1 and MC2 are shown as an example.

The memory cells MC1 and MC2 comprise a MOS transistor and a capacitor, as shown in FIG. 2, wherein a gate of the MOS transistor is connected to a word line, one terminal is connected to a bit line BL or BLB and the other terminal is connected to the capacitor. Thus, when the word line is activated, that is, held at a high level, the transistor of the memory cell becomes conductive and the capacitor is connected to the bit line BL or BLB.

Note that, in the memory cell, a connection point of the transistor and the capacitor is called a storage node STN and predetermined charges are stored in the capacitor when writing, so that the storage node STN is held at a certain potential in accordance with write data.

The bit line equalizer 102 and the sense amplifier 150a are the same as the respective components of the DRAM of the related art explained above. Namely, the bit line equalizer 102 precharges the bit lines BL and BLB to be at a predetermined potential Vb in accordance with an activated bit line equalization signal BLEQ before reading or writing. After the precharging, the bit line equalization signal BLEQ is reset and the bit lines BL and BLB are held in a floating state.

The sense amplifier 150a amplifies a potential difference of the bit lines BL and BLB when reading or writing and also serves as a latch circuit for holding a voltage of the amplified bit lines BL and BLB.

A write gate 162 and an intermediate amplification circuit 164 shown in FIG. 2 are included in the column selector 160 shown in FIG. 1.

The write gate 162 comprises transfer gates TG1 and TG2, as shown in FIG. 2. As shown in FIG. 2, the transfer gate TG1 is connected between the bit line BL and the data line LIO, and the transfer gate TG2 is connected between the bit line BLB and the data line LIOB. A gate of a nMOS transistor gate constituting the transfer gates TG1 and TG2 is applied a column write selection signal CSW, and a gate of a PMOS transistor gate constituting the transfer gates TG1 and TG2 is applied a column write selection signal CSWB.

Note that the column write selection signals CSW and CSWB are generated by the column decoder 140 shown in FIG. 1 and held at mutually different logic levels. When writing, the column decoder 140 selects a specified column in accordance with an input column address CADR and activates column write selection signals CSW and CSWB corresponding thereto.

For example, a column write selection signal CSW corresponding to the selected column is held at a high level, the CSWB is held at a low level, transfer gates TG1 and TG2 become conductive in response thereto, and the bit lines BL and BLB are connected to the data lines LIO and LIOB, respectively. On the other hand, when in a non-selected state, the column write selection signal CSW is held at a low level and CSWB is held at a high level, so that the transfer gates TG1 and TG2 are cut off and the bit lines BL and BLB are separated from the data lines LIO and LIOB.

The intermediate amplification circuit 164 comprises nMOS transistors Q4, Q5, Q6 and Q7, as shown in FIG. 2. The transistors Q4 and Q5 constitute a differential amplification circuit. Namely, sources of the transistors Q4 and Q5 are connected to a reference potential in common, a gate of the transistor Q4 is connected to the bit line BLB, and a gate of the transistor Q5 is connected to the bit line BL. A collector of the transistor Q4 is connected to the data line LIO via the transistor Q6, and a collector of the transistor Q5 is connected to the data line LIOB via the transistor Q7.

Gates of the transistors Q6 and Q7 are applied a column read selection signal CSR. Note that the column read selection signal SCR is generated by the column decoder 140 shown in FIG. 1, and the column read selection signal CSR corresponding to a selected column is activated and held at a high level when reading.

Therefore, when reading, the transistors Q6 and Q7 of the intermediate amplification circuit 164 corresponding to the selected column become conductive, and voltages of the bit lines BL and BLB are input to the gates of the transistors Q5 and Q4, respectively. Then, signals amplified by the transistors Q4 and Q5 are output to the data lines LIO and LIOB via the transistors Q6 and Q7.

As explained above, in the DRAM of the present embodiment, the write gate 162 and the intermediate amplification circuit 164 are provided between the bit lines BL and BLB and data lines LIO and LIOB of each column. When writing, by making the transfer gates TG1 and TG2 of the write gate 162 conductive at a desired timing, writing to a selected memory cell can be performed at the same time with the reading and re-writing operation in non-selected memory cells. Compared with random access writing in the DRAM of the related art, a longer charge storing time to a selected memory cell can be secured and writing at a high speed can be attained. Below, a writing operation will be explained with reference to a circuit diagram and timing charts of the DRAM of the present embodiment.

FIG. 3A to FIG. 3F are timing charts of a writing operation of the present embodiment. Below, a writing operation of the DRAM of the present embodiment will be explained with reference to FIG. 2 and FIG. 3.

Before starting to write, the bit line equalization signal BLEQ is in an activated state and the bit lines BL and BLB are precharged at a voltage Vb. At a time t0 when writing starts, the bit line equalization signal BLEQ is reset and the bit lines BL and BLB are held in a floating state.

Then, as shown in FIG. 3B, at a time t1, the selected word line WL is activated. Also as shown in FIGS. 3E and 3F, the column write selection signals CSW and CSWB are activated at the point when the data lines LIO and LIOB are fixed at voltages in accordance with write data, respectively.

Namely, when writing, the word line WL is activated and the column write selection signals CSW and CSWB are activated. Consequently, signal voltages of the data lines LIO and LIOB are applied to the selected bit lines BL and BLB through the write gate 162, respectively. As explained above, when writing starts, data writing to the selected memory cell starts in the DRAM of the present embodiment. On the other hand, normal reading and rewriting by read data are performed on memory cells other than the selected memory cell connected to the selected word line.

Below, a timing of writing will be explained further in detail with reference to FIG: 3A to 3F. As shown in FIG. 3C, when the column write selection signals CSW and CSWB are activated, signal voltages of the data lines LIO and LIOB are applied to the bit lines BL and BLB, respectively. In response to this, the storage node STN of the selected memory cell is charged in accordance with the write data and a node voltage is changed.

At a time t2, the sense amplifier is supplied with drive voltages SDP and SDN. The sense amplifier operates in response to this, and a potential difference of the bit lines BL and BLB is amplified. Then, at a time t3 when voltages of the bit lines BL and BLB are in a state of being latched by the sense amplifier, the column write selection signals CSW and CSWB are reset. Namely, the column write selection signal CSW is held at a low level and the CSWB is held at a high level. As a result, the transfer gates TG1 and TG2 of the write gate 162 are cut off, the bit line BL is separated from the data line LIO and the bit line BLB is separated from the data line LIOB.

Figure 3:
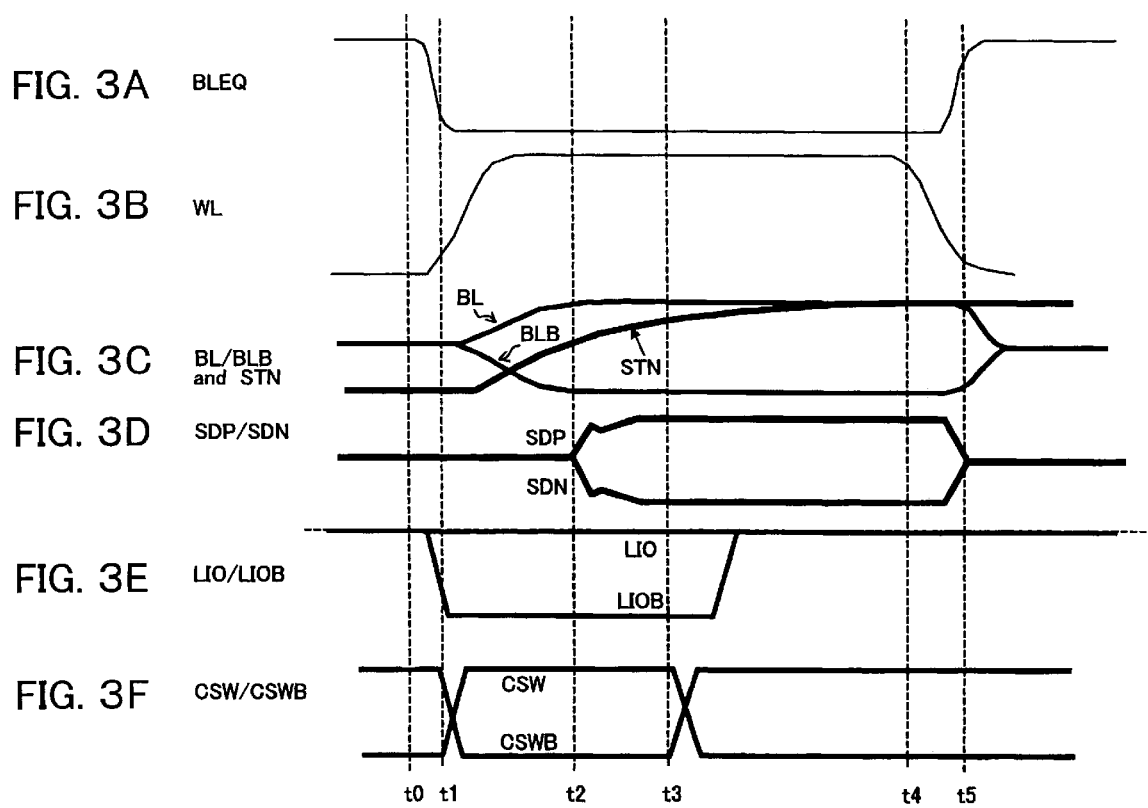
FIGS. 3A to 3F are timing charts of a writing operation of the DRAM of the present embodiment.

After that, when the sense amplifier is continuously supplied with drive voltages SDP and SDN, charges are stored in the capacitor of the selected memory cell, and the potential of the storage node STN reaches at a predetermined level, that is, at a time t4 shown in FIG. 3, the word line WL is reset. Continuously, the drive voltages SDP and SDN supplied to the sense amplifier are reset and the bit line equalization signal BLEQ is activated. As a result, the bit lines BL and BLB are precharged at a voltage Vb to prepare for the next writing or reading operation.

As explained above, in the DRAM of the present embodiment, at the time of activating a selected word line WL, column write selection signals CSW and CSWB are also activated when writing, the write gate 162 becomes conductive in response to this, and write signals of the data lines LIO and LIOB are applied to the selected bit lines BL and BLB. After that, drive voltages SDP and SDN are supplied to the sense amplifier 150a, the sense amplifier amplifies a potential difference of the bit lines BL and BLB and, furthermore, voltages of the bit lines BL and BLB are latched. As a result, charges are stored in the capacitor of the selected memory cell in accordance with write data, the potential of the storage node STN is changed, and when the potential reaches a desired level, the word line WL is reset, the supply of the drive voltages to the sense amplifier stops, the bit lines BL and BLB are precharged for the next writing or reading, and the writing operation is completed.

As explained above, in the DRAM of the present embodiment, data writing to the selected memory cell is performed at the same time of performing reading and rewriting on the non-selected memory cells when writing. Namely, the time from activation of a word line to generation of bit line potential difference by stored charges of the storage node and activation of the sense amplifier in the DRAM of the related art can be used for writing to the storage node. As a result, compared with a writing operation to the DRAM of the related art, for example when performing writing by the same writing cycle, the time for storing charges to the capacitor of the selected memory cell can be secured longer and the stability of writing data can be improved.

Note that in the DRAM of the present embodiment, since the selected bit lines BL and BLB are driven at the same time when writing, an affection by noise on adjacent bit lines subjected to refreshing is a concern due to coupling between bit lines. Therefore, in the present embodiment, for example, by applying a twist layout to the bit lines and in the sense amplifier, coupling between adjacent bit lines can be cancelled, so that an affection by a selected bit line pair for performing writing on the bit lines can be suppressed and the credibility of stored data can be improved.

Second Embodiment

Figure 4:
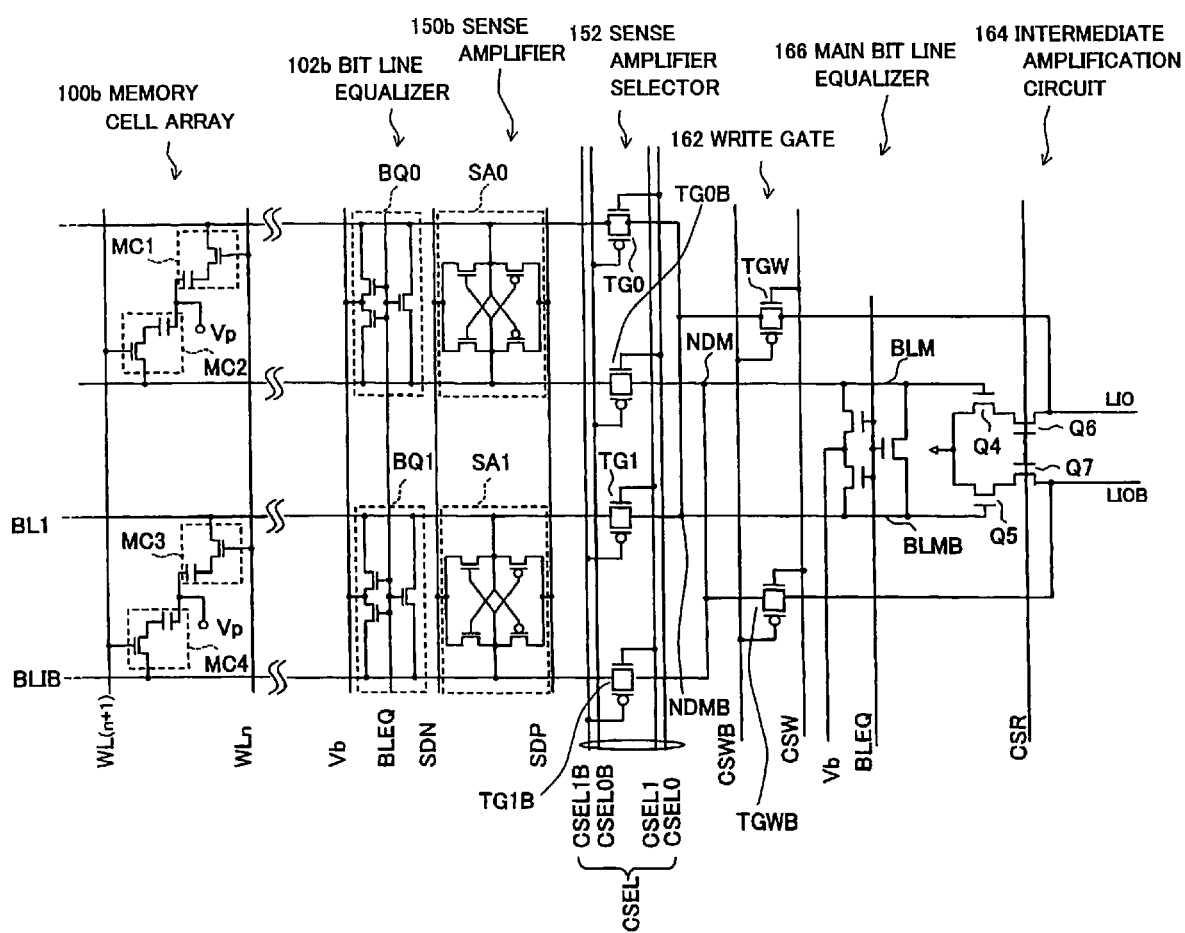
FIG. 4 is a circuit diagram of a second embodiment of the DRAM of the present invention.
Figure 5:
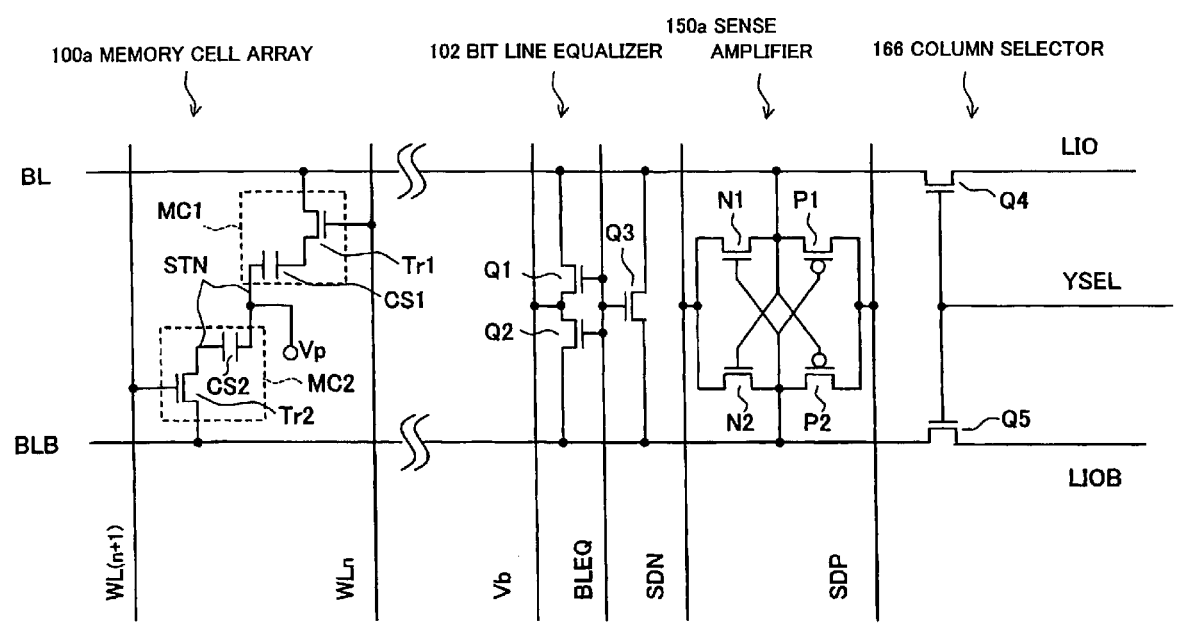
FIG. 5 is a circuit diagram of a configuration example of a DRAM of the related art.

FIG. 4 is a circuit diagram of a second embodiment of a semiconductor memory device according to the present invention.

As shown in FIG. 2, the semiconductor memory device of the present embodiment is a DRAM configured by sharing a write gate 162 and a intermediate amplification circuit 164 by a plurality of columns.

In FIG. 4, a DRAM having the configuration of sharing the write gate 162 and the intermediate amplification circuit 164 by two columns is shown as an example. As shown in FIG. 4, in the DRAM of the present embodiment, a bit line pair composed of bit lines BL0 and BL0B and a bit line pair composed of bit lines BL1 and BL1B are provided by corresponding to two columns, respectively.

In the memory cell array 110b, the memory cell MC1 is connected to the bit line BL0 and the memory cell MC2 is connected to the bit line BL0B. Also, the memory cell MC3 is connected to the bit line BL1, and the memory cell MC4 is connected to the bit line BL1B. The memory cells MC1 and MC3 are selected by a word line $WL_n$, and the memory cells MC2 and MC4 are selected by a word line $WL_{n+1}$.

The bit line pair composed of the bit lines BL0 and BL0B is provided with a bit line equalizer BQ0 and a sense amplifier SA0, and the bit line pair composed of the bit lines BL1 and BL1B is provided with a bit line equalizer BQ1 and a sense amplifier SA1.

As shown in FIG. 4, a transfer gate TG0 is provided between the bit line BL0 and a note NDMB, and a transfer gate TG0B is provided between the bit line BLB and a node NDM. Also, a transfer gate TG1 is provided between the bit lien BL1 and the node NDMB, and a transfer gate TG1B is provided between the bit line BL1B and the node NDM.

A gate of the nMOS transistor constituting the transfer gates TG0 and TG0B is connected to a signal line to be applied with a column selection signal CSEL0, and a gate of the pMOS transistor is connected to a signal line applied with a column selection signal CSEL0B. On the other hand, a gate of the nMOS transistor constituting the transfer gates TG1 and TG1B is connected to a signal line applied with a column selection signal CSEL1, and a gate of the PMOS transistor is connected to a signal line applied with a column selection signal CSEL1B.

A sense amplifier selector 152 comprises transfer gates TG0, TG0B, TG1 and TG1B. Thus, in a state that the column selection signal CSEL0 is at a high level and the CSEL0B is at a low level, the transfer gates TG0 and TG0B become conductive and the sense amplifier SA0 is selected. On the other hand, in a state that the column selection signal CSEL1 is at a high level and the CSEL1B is at a low level, the transfer gates TG1 and TG1B become conductive, and the sense amplifier SA1 is selected.

Note that column selection signals CSEL0, CSEL0B, CSEL1 and CSEL1B are supplied by the column decoder.

The write gate 162 is shared by two columns corresponding to the sense amplifiers SA0 and SA1. As shown in FIG. 4, the write gate 162 comprises transfer gates TGW and TGWB. The transfer gate TGW is provided between the node NDMB and the data line LIO, and the transfer gate TGWB is provided between the node NDM and the data line LIOB.

A gate of the nMOS transistor constituting the transfer gates TGW and TGWB is connected to a signal line applied with a column write selection signal CSW, and a gate of a PMOS transistor constituting the transfer gates is connected to a signal line applied with a column write selection signal CSWB. Therefore, when the column write selection signal CSW is at a high level and the CSWB is at a low level, the transfer gates TGW and TGWB become conductive, the node NDMB is connected to the data line LIO, and the node NDM is connected to the data line LIOB.

As shown in FIG. 4, the node NDM is connected to a main bit line BLM, and the node NDMB is connected to a main bit line NLMB. A bit line pair composed of the main bit lines BLM and BLMB is provided with a main bit line equalizer 166 and an intermediate amplification circuit 164.

The main bit line equalizer 166 equalizes the main bit lines BLM and BLMB in accordance with a bit line equalization signal BLEQ. Namely, when the bit line equalization signal BLEQ is activated, the main bit lines BLM and BLMB are precharged at the voltage Vb.

The intermediate amplification circuit 164 amplifies a potential difference of the main bit lines BLM and BLMB and outputs the amplification result to the data lines LIO and LIOB.

As shown in FIG. 4, the intermediate amplification circuit 164 comprises the transistors Q4, Q5, the intermediate amplification circuit 164 composing a differential amplification circuit, and transistors Q6 and Q7 provided between the data lines LIO and LIOB. Gates of the transistors Q6 and Q7 are connected to a signal line applied with a column read selection signal CSR.

The intermediate amplification circuit 164 operates at the time of reading. A gate of the transistor Q4 is applied with a voltage of the main bit line BLM, and a gate of the transistor Q5 is applied with a voltage of the main bit line BLMB. Thus, when reading, a potential difference of the main bit lines BLM and BLMB is amplified by the intermediate amplification circuit 164. Also, when reading, the column read selection signal CSR is activated, that is, held at a high level, so that the transistors Q6 and Q7 become conductive, and amplification results by the transistors Q4 and Q5 are output to the data lines LIO and LIOB via the transistors Q6 and Q7.

Next, a writing operation of the DRAM of the present embodiment explained above will be explained.

Before starting to write, the bit line pair corresponding to the respective column and the main bit line pair composed of the main bit lines BLM and BLMB are equalized in accordance with the activated bit line equalization signal and all bit lines are precharged at a voltage of Vb. Then, a selected word line is activated, and transistors of memory cells connected to the selected word line become conductive in each column. Along with the activation of the word line, the column write selection signals CSW and CSWB are activated, and in response to this, the transfer gate of the write gate 162 becomes conductive. Furthermore, one of a plurality of sense amplifiers is selected by the sense amplifier selector 152, and a transfer gate corresponding to that is controlled to become conductive.

As a result, since a write signal applied to the data lines LIO and LIOB is applied to the bit line pair corresponding to the selected column via the write gate 162 and the sense amplifier selector 152, charges are stored in the capacitor of the selected memory cell in accordance with write data.

When writing, in the sense amplifier selector 152, since the transfer gate corresponding to the selected column becomes conductive in accordance with the column selection signal CSEL, and other transfer gates are controlled to be cut off, the write signal in accordance with the write data is applied only to the bit line pair of the selected column. Also, along with the activation of the selected word line, the column write selection signal CSW/CSWB and the column selection signal corresponding to the selection column are activated, so that data writing to the selected memory cell is performed at the same time with reading and rewriting performed on non-selected memory cells.

Note that when reading, a predetermined column is selected from a plurality of columns by the sense amplifier selector 152 in the same way as in writing, and a bit line voltage amplified by the sense amplifier of the selected column is input to the intermediate amplification circuit 164 via the main bit line pair. Then, the voltage amplified by the intermediate amplification circuit 164 is output to the data lines LIO and LIOB, so that data stored in the selected memory cell can be read out to the outside.

As explained above, according to the present embodiment, a plurality of columns shares the write gate 162 and the intermediate amplification circuit 164, a predetermined sense amplifier is selected by the sense amplifier selector 152 when writing, and a write signal in accordance with the write data is applied to the corresponding bit line pair, so that data writing to the selected memory cell is performed. Furthermore, in the present embodiment, in the same way as in the first embodiment explained above, writing of data to the selected memory cell is performed at the same time with reading and re-writing in non-selected memory cells when writing, so that a time for storing charges to the capacitor of the selected memory cell can be secured long, credibility of stored data can be improved, the writing time can be made short, and a write cycle at a high speed can be realized.

As explained above, according to the semiconductor memory device of the present invention, compared with the DRAM of the related art, the writing time can be made short, a stored charge amount in a capacitor of a memory cell can be sufficiently secured, and the credibility of writing data can be improved.

Also, according to the present invention, the writing time can be made short and high speed random accessing can be realized in a random access operation of the DRAM.

The embodiments explained above are for easier understanding of the present invention and not to limit the present invention. Accordingly, respective elements disclosed in the above embodiments include all modifications in designs and equivalents belonging to the technical field of the present invention.

What is claimed is:

1. A semiconductor memory device including word lines provided for every row of a memory cell and bit lines provided for every column of the memory cell, wherein a memory cell array is configured by arranging in a matrix memory cells for storing data in accordance with stored charges of capacity elements, comprising:

a write gate provided between a bit line and an input/output data line, which becomes a conductive state when a selected word line becomes an activation state when writing and selectively applies to the bit line a write signal applied to an input output data line in accordance with write data.

2. A semiconductor memory device as set forth in claim 1, comprising a decoder circuit wherein said write gate comprises a switching element connected between the bit line and input/output data line, and generates a selection signal for making the switching element corresponding to a column selected by an input address conductive and supplies to the write gate when writing.

3. A semiconductor memory device as set forth in claim 1, wherein a bit line pair composed of two bit bit pair are arranged to be a twist layout in the memory cell array.

4. A semiconductor memory device including word lines provided for every row of a memory cell and bit lines provided for every column of the memory cell, wherein a memory cell array is configured by arranging in a matrix memory cells for storing data in accordance with stored charges of capacity elements, comprising:

a column selection circuit for selecting one from a plurality of column in accordance with an address; and a write gate provided between the column selection circuit and input/output data line, which becomes a conductive state when a selected word line becomes an activation state when writing and applies to the selected bit line a write signal applied to the input/output data line in accordance with write data via the column selection circuit.

5. A semiconductor memory device as set forth in claim 4, wherein a bit line pair composed of two bit lines is provided to each column and two bit lines of the bit pair are arranged to be a twist layout in the memory cell array.

* * * * *

UNITED STATES PATENT AND TRADEMARK OFFICE
CERTIFICATE OF CORRECTION

| | | |
|---|---|---|
| PATENT NO. | : 7,012,831 B2 | Page 1 of 1 |
| APPLICATION NO. | : 10/749559 | |
| DATED | : March 14, 2006 | |
| INVENTOR(S) | : Kenichi Shigenami | |

It is certified that error appears in the above-identified patent and that said Letters Patent is hereby corrected as shown below:

Column 12:
Line 55, "supplies" should read -- supplies the signal --.

Line 58, "two bit" should read -- two bit lines is provided to each column and two bit line of the --.

Line 67, "column" should read -- columns--.

Signed and Sealed this

Thirteenth Day of February, 2007

JON W. DUDAS
*Director of the United States Patent and Trademark Office*